United States Patent [19]

Dougherty et al.

[11] Patent Number: 4,756,078
[45] Date of Patent: Jul. 12, 1988

[54] INTEGRATED CIRCUIT PACKAGE EXTRACTION TOOL

[75] Inventors: Michael J. Dougherty, Lansdale; Robert E. MacMullin, Exton, both of Pa.

[73] Assignee: Microdot Inc., Darien, Conn.

[21] Appl. No.: 45,523

[22] Filed: May 4, 1987

[51] Int. Cl.⁴ .......................................... H05K 13/04
[52] U.S. Cl. .......................................... 29/764; 29/268
[58] Field of Search ............... 29/741, 764, 758, 267, 29/268

[56] References Cited

U.S. PATENT DOCUMENTS

| | | | |
|---|---|---|---|
| 4,152,827 | 5/1979 | Walton, II | 29/764 |
| 4,519,130 | 5/1985 | Schaefer | 29/764 |

Primary Examiner—Carl E. Hall
Attorney, Agent, or Firm—Lyman R. Lyon

[57] ABSTRACT

A tool to extract an integrated circuit package from a socket with minimal damage to package or socket.

6 Claims, 3 Drawing Sheets

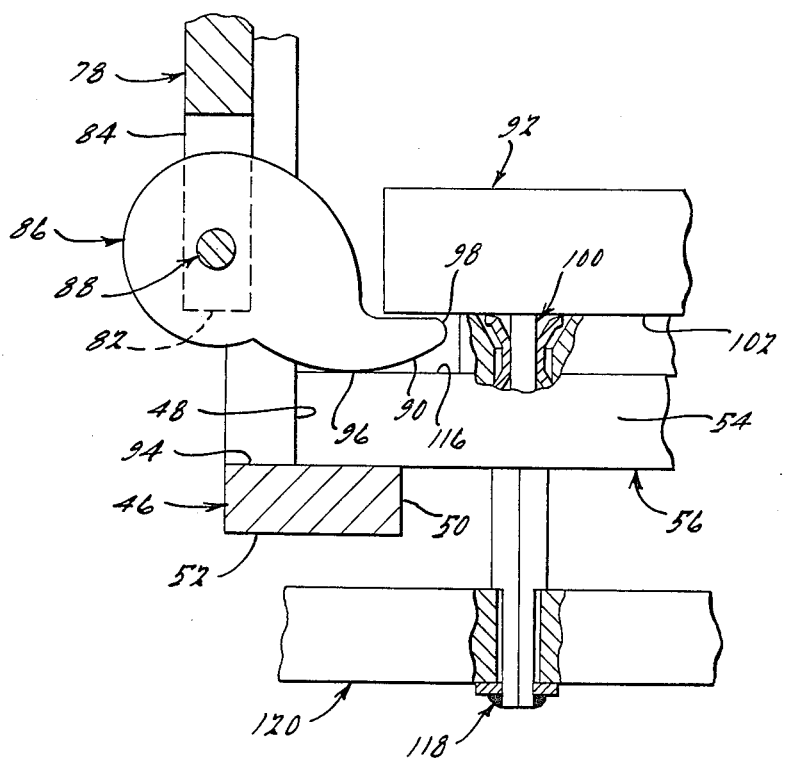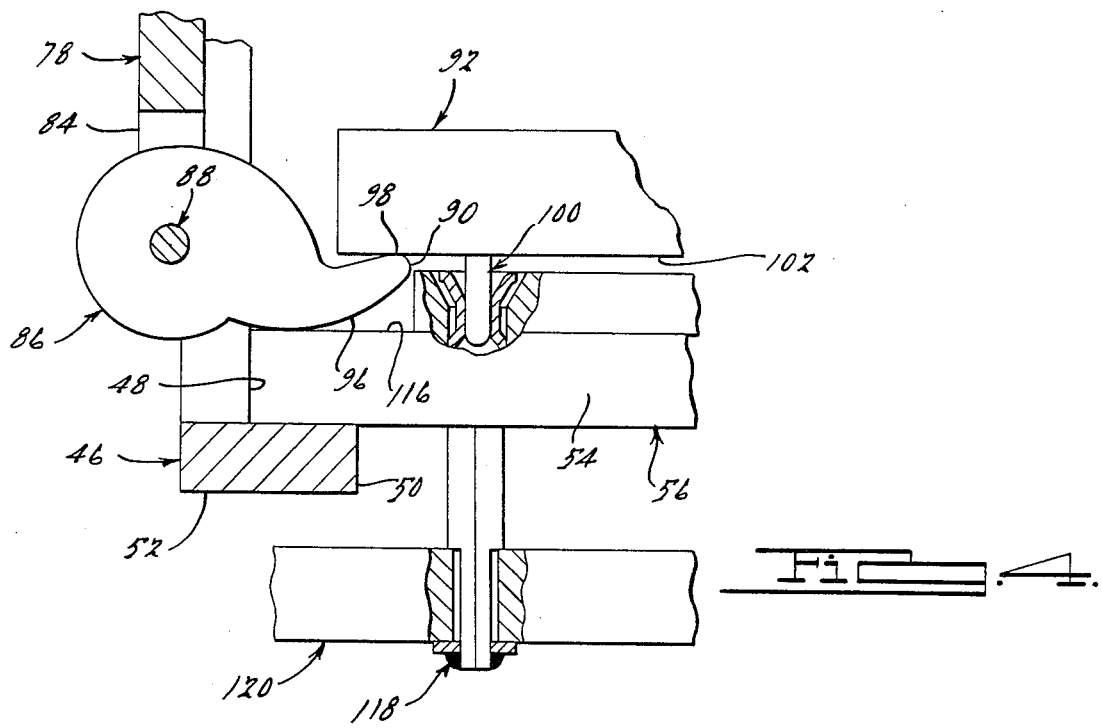

INTEGRATED CIRCUIT PACKAGE EXTRACTION TOOL

BACKGROUND OF THE INVENTION

The invention relates to tools employed to remove an integrated circuit package, such as a pin grid array package, from a socket mounted upon a printed circuit board (PCB).

The prior art teaches the use of tools which apply leverage to an integrated circuit package in order to pry it from its conjugate socket. The tool is wedged between the adjoining surfaces of the package and socket, and leverage is applied until the package and socket are completely separated. However, it is extremely difficult to isolate all of the force thus applied solely in the direction collinear with the pins on the package. Hence, the pins are likely to be bent to one side during removal by the force components in the plane normal thereto. The pins are structurally delicate and typically cannot withstand the bending required to return the pins to their original configuration. The breakage of the pins is thus likely to occur during straightening, thereby rendering the package unusable. Moreover, the forces exerted upon the package and socket during removal may be transmitted to the solder joints whereby the socket is attached to the PCB. The application of such prying force may thus create cracks in the solder joints or, perhaps, even physical separation between the socket and the PCB. This is of special concern where surface mounting techniques are employed, due to the frangibility of such connections.

It is to be noted that the aforementioned difficulties are exacerbated with a pin grid array package where perhaps hundreds of pins are placed in several nested peripheral rows about the underside of the package. Unlike the familiar dual-in-line package (DIP), there is no portion in the periphery of a pin grid array package lacking pins wherein a conventional tool may be inserted. Hence, there is the additional likelihood of damage resulting from the direct physical contact between the tool and the pins of the package. Moreover, the high number of pins additionally increases the amount of force required to separate the package from its conjugate socket, thereby increasing the likelihood of damage to the solder joints whereby the socket is connected to the PCB.

SUMMARY OF THE INVENTION

The tool of the instant invention allows for the extraction of an integrated circuit package, particularly a pin grid array package, from a socket without damaging the pins thereof or the solder joint connections whereby the socket is mounted upon the PCB.

The tool comprises a plurality of rotatable cams having lobe surfaces formed thereon. The cams are placed in like numbers on opposite sides of the integrated circuit package and socket assembly with the lobe surfaces of each cam extending therebetween so as to engage with the package and socket, respectively. The cams are rotated simultaneously to produce a separating force that is collinear with the longitudinal axis of the pins. Separation by such cam rotation avoids force components in the plane normal to the longitudinal axis of the pins and, thus, the likelihood of pin damage from bending upon package extraction is greatly reduced. For example, the nominal frictional forces between the lobe surfaces and the package and socket surfaces contacted therewith are cancelled out by those generated by the oppositely situated cam, resulting in a zero net frictional force transmitted to the pins in the plane normal to the longitudinal axis of the pins.

The tool of the instant invention simultaneously rotates the cams by displacing the rotational axes thereof in the direction normal to the plane of engagement between the package and the socket, whereby cam rotation is produced by pivoting a lobe surface thereof against the socket insulator. Such displacement is in turn generated by moving the pair of members that rotatably support the cams relative to a second pair of members held in contiguity with the peripheral portion of the underside of the socket insulator. The resultant clamping of the socket insulator between the lobe surfaces contacting therewith and the second pair of support members provides opposing forces of equal magnitude that produce cam rotation while placing zero net load on the solder joints by which the socket is mounted upon the PCB. The integrated circuit package is thus extracted without damage to either the pins or the socket mounting connections.

The instant invention additionally incorporates force amplification means comprising a lever and fulcrum configuration to increase the supporting member displacement force and, hence, the cam rotational force. Thus, the tool provides the increased separating force required for packages having a large number of pins without risking damage to the socket's mounting connections otherwise likely to result from such increased force. The use of a plurality of cams inserted between the package and socket generates the required separation force with cam lobe surfaces of reduced width, thereby reducing the likelihood of damaging direct physical contact between the lever arms and the pins. Additionally, the preferred embodiment of the instant invention disclosed hereinbelow is adjustable so as to accommodate a variety of sizes of integrated circuit packages with the same tool.

BRIEF DESCRIPTION OF THE DRAWINGS

FIG. 3 is an enlarged view of the rotatable cam along line 3—3 of FIG. 1 with the lobe surfaces thereof inserted between an integrated circuit package and its conjugate socket.

FIG. 4 is a view of the cam similar to that of FIG. 3 upon rotation thereof.

DETAILED DESCRIPTION OF THE PREFERRED EMBODIMENT OF THE INVENTION

Figure 1:
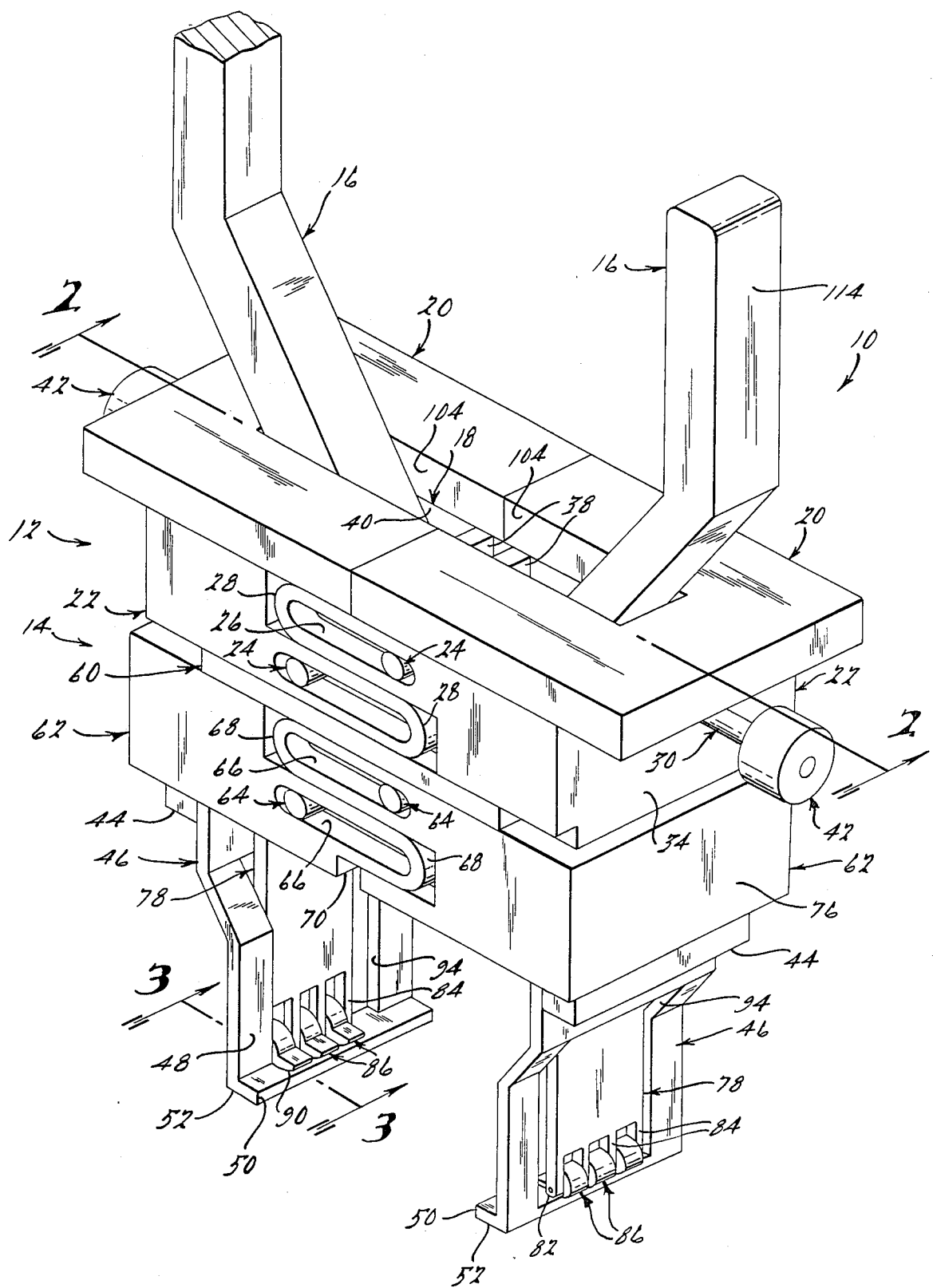
FIG. 1 is a view in perspective of an integrated circuit package extraction tool constructed in accordance with the instant invention.
Figure 2:
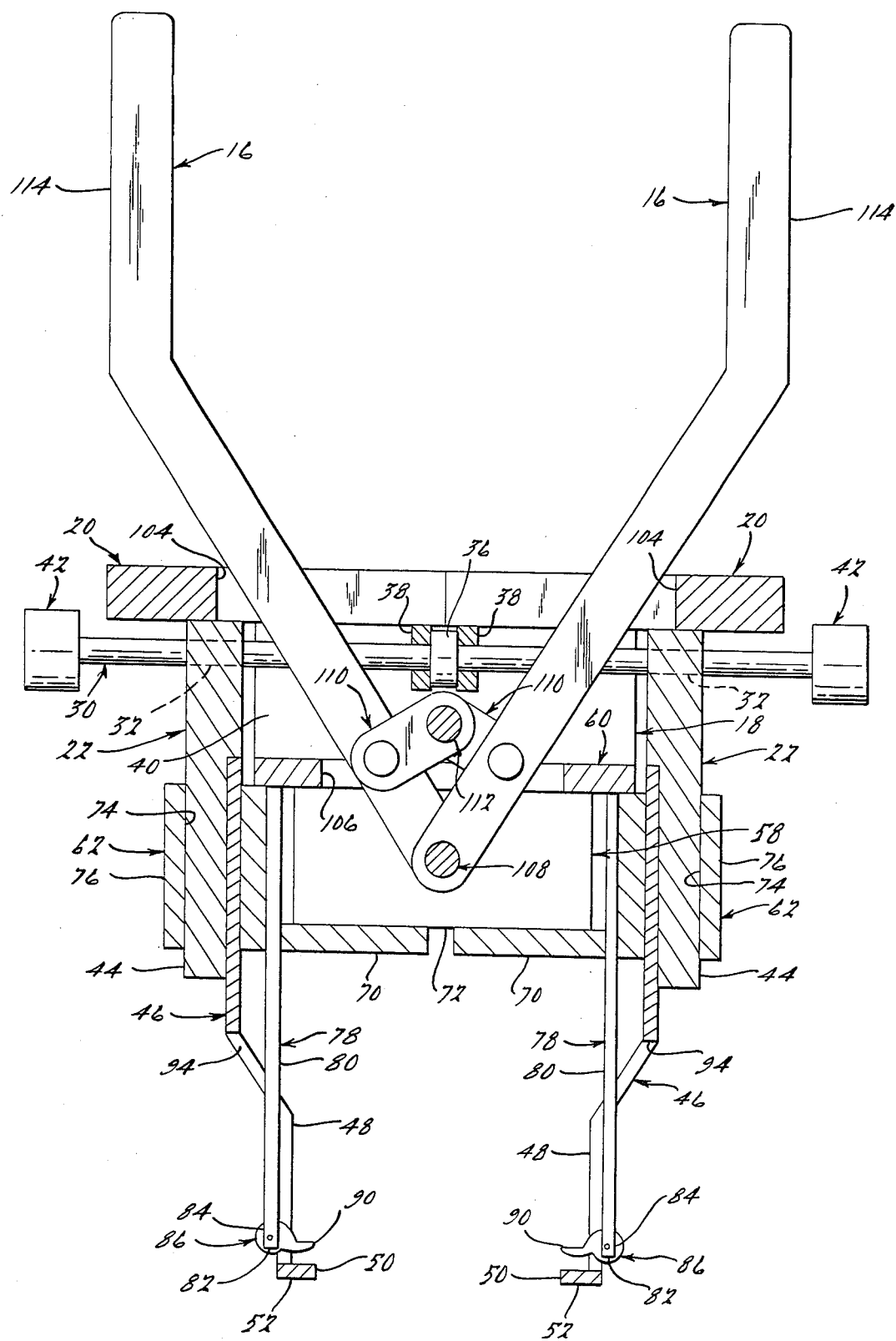
FIG. 2 is a sectional view of the tool along line 2—2 of FIG. 1.

Referring to FIG. 1, an integrated circuit package extraction tool 10 constructed in accordance with the instant invention comprises an upper slide assembly 12, a lower slide assembly 14, and a pair of operating levers 16 protruding from the upper slide assembly 12. The upper slide assembly 12 comprises a pair of upper slide bases 18 rigidly maintained in parallel by a pair of upper cover plates 20. A pair of U-shaped upper slides 22 are slidably mounted about the longitudinal ends of the pair of upper slide bases 18. The movement of each upper slide 22 relative thereto is limited by screw rollers 24 secured to the upper slide bases 18 and projecting through the longitudinal slots 26 formed in the legs 28 of the upper slides 22. As best seen in FIG. 2, an adjusting screw 30 is inserted through a threaded aperture 32 formed in the bight portion 34 of each upper slide 22. The adjusting screw 30 is additionally provided with a longitudinally centered outwardly extending flange 36 which is contained by a pair of tangs 38 projecting outwardly from the cofacially disposed surfaces 40 of the upper slide bases 18. Upon rotation of the adjusting screw 30 with the aid of the knurled thumb-wheels 42 situated on either end thereof, each upper slide 22 is controllably moved a like distance toward or away from the upper slide bases 18.

Each upper slide 22 is additionally provided with a tongue 44 projecting transversely from the bight portion 34 thereof. An upper slide plate 46 is affixed thereto so as to provide a surface 48 extending therefrom which is normal to the longitudinal axis of the legs 28 of the upper slide 22. As best seen in FIG. 3, a flange 50 is formed on the free edge 52 of each upper slide plate 46 so as to provide upon assembly a pair of parallel plates 46 having opposed surfaces 48 between which the insulator 54 of an integrated circuit package socket 56 is clamped upon rotation of the adjusting screw 30, whereby the opposed flanges 50 are placed in contiguity with the peripheral portion of the underside of the socket insulator 54.

Similarly, FIGS. 1 and 2 show the lower slide assembly 14 comprising a pair of lower slide bases 58 rigidly maintained in parallel by a lower cover plate 60. A pair of lower slides 62 are laterally slidably mounted about the opposite ends thereof. The movement of each lower slide 62 relative to the lower slide bases 58 is limited by screw rollers 64 secured to the lower slide bases 58 and projecting through the longitudinal slots 66 formed in the legs 68 of each lower slide 62. Each lower adjusting slide 62 is provided with a web portion 70 extending between the legs 68 thereof which is placed upon assembly in contiguity with the under surface 72 of each lower slide base 58. Each lower slide 62 is also provided with a slot 74 formed transversely in the bight portion 76 thereof to receive the tongue 44 of the upper slide 22. Upon assembly, each pair of upper and lower slides 22 and 62 are interlocked by inserting tongue 44 within slot 74, thereby ensuring like lateral movement of both upper and lower slides 22 and 62 with respect to the upper and lower slide bases 18 and 58 upon rotation of the adjusting screw 30. The tongue and slot configuration additionally allows for ready displacement of each upper slide 22 transversely of its conjugate lower slide 62.

Each lower slide 62 is provided with a lower slide plate 78 affixed to the bight portion 76 thereof so as to generate a surface 80 extending therefrom which is normal to the longitudinal axis of the legs 68 thereof. The free edge 82 of the lower slide plate 78 is provided with two or more longitudinally extending segments 84 between which a plurality of cams 86 are rotatably mounted about pin shaft 88, as shown in FIG. 3. The lower slide plate 78 is positioned relative to the upper slide plate 46 upon assembly so that a lobe 90 formed on each cam 86 is inserted between the integrated circuit package 92 and the socket insulator 54 as the inner surface 48 of the upper slide plate 46 is clamped about the periphery of the socket insulator 54. If necessary, this is accomplished by offsetting the lower portion of the upper slide plate 46 inwardly of the lower slide plate 78, with the lower slide plate 78 passing freely through a rectangular aperture 94 formed therein, as shown in FIG. 1. The width of cam lobe surfaces 96 and 98 is such that the cam lobe 90 can be inserted between the individual pins 100 protruding from the underside 102 of the package 92, thereby avoiding damaging physical contact therebetween.

Referring to FIG. 2, the operating levers 16 extend through the opposing slots 104 formed in the upper cover plates 20 and a rectangular slot 106 formed in the lower cover plate 60 to be jointly rotatably mounted on a cylindrical shaft 108 extending between the lower slide bases 58. Each lever 16 is also connected by a fulcrum link 110 to a similar shaft 112 extending between the upper slide bases 18. The upper and lower slide assemblies 12 and 14 are thus controllably separated longitudinally of the tongues 44 and slots 74 by relative movement of the operating levers 16, with the lever and fulcrum configuration providing force amplification. The grip portions 114 of the operating levers 16 are bent to provide parallel grip surfaces for use by the operator.

In operation, the tool 10 constructed in accordance with the instant invention is adjusted by rotating the knurled thumb-wheels 42 of the adjusting screw 30 so as to clamp the inner surface 48 of the upper slide plate 46 about the periphery of the socket insulator 54. The cam lobes 90 and thus inserted between the integrated circuit package 92 and the socket insulator 54, with the lobe surfaces 96 thereof being placed in contact with the upper surface 116 of the socket insulator 54 when the inner surface 48 of the upper slide plate 46 is adjusted into contiguity with the peripheral surface of the socket insulator 54. The grip portions 114 of the operating levers 16 are moved toward one another, thereby separating the upper and lower slide assemblies 12 and 14 in the longitudinal direction of the tongues 44 and slots 74 thereof. The free edges 82 of both lower slide plates 78 are thus displaced toward the flanges 50 of the upper slide plates 46, thereby clamping the socket insulator 54 between the flanges 50 and the cam lobes 90. The cam lobe surfaces 96 pivot against the upper surface 116 of the socket insulator 54, thereby producing simultaneous rotation of the cams 86, as illustrated in FIG. 4. The lobe surfaces 98 of the cams 86 thus bear upwardly against the underside 102 of the package 92, whereby the package 92 is separated from the socket 54. Since the separating force is collinear with the pins 94 of the package 90, the pins 94 are not subject to bending upon separation of the package 90 from the socket 56. Moreover, the equal and opposite forces thus applied to the socket insulator 54 result in zero loading of the solder joint connections 118 whereby the socket 56 is mounted to the printed circuit board 120.

It is to be noted that, although the tool of the instant invention is particularly well suited for use with pin grid array packages, the tool enjoys a wide range of applicability, from DIPs to periphery-loaded LSI, VSLI, and leadless integrated circuit packages.

While the preferred embodiment of the invention has been disclosed, it should be appreciated that the invention is susceptible of modification without departing from the spirit of the invention or the scope of the subjoined claims.

We claim:

1. A tool for the extraction of a coplanar array of integrated circuit pins from a parallel coplanar array of pin sockets comprising a pair of rotatable cams, each of said cams having lobe surfaces engageable with said pins and socket arrays, respectfully;

means for positioning the lobe surfaces of said cams between said pin array and said socket array; and means for rotating said cams by simultaneously displacing the axis of rotation of each of said cams towards said socket array in the direction normal to the plane of engagement between said pin array and said socket array, whereby one of the lobe surfaces is pivoted against said socket array to produce said rotation, and whereby said pin array is separated from said socket array.

2. The tool of claim 1 wherein said means for rotating said cams for simultaneously displacing the axis of rotation of each of said cams comprises a pair of first supporting members to which said cams are rotatably mounted;

a pair of second supporting members; and means for moving said first members relative to said second members to effect clamping of said socket array between one of the lobe surfaces of said cams and said second members, whereby zero net force is applied to said socket array.

3. The tool of claim 2 wherein said means for moving said first members relative to said second members comprises a first and second lever pivoted about a common axis, whereby movement of said first lever relative to said second lever produces like movement of said first members relative to said second members.

4. The tool of claim 3 including force amplification means, whereby movement of said first lever relative to said second lever produces a lessor movement of said first members relative to said second members, whereby said lesser movement is of greater force amplitude than said first lever movement.

5. The tool of claim 1 wherein the lobe surfaces are defined by a radially outwardly extending lobe.

6. The tool of claim 1 wherein the lobe surfaces are defined by a lobe extending tangentially from a point on said cam radially offset from the rotational axis thereof.

* * * * *